US012631675B2

(12) United States Patent
Kubono et al.

(10) Patent No.: US 12,631,675 B2
(45) Date of Patent: May 19, 2026

(54) INFORMATION PROCESSING APPARATUS, NON-TRANSITORY COMPUTER READABLE MEDIUM, AND METHOD FOR PROCESSING INFORMATION

(71) Applicant: FUJIFILM Business Innovation Corp., Tokyo (JP)

(72) Inventors: Masahito Kubono, Kanagawa (JP); Amiko Chihara, Kanagawa (JP); Hayato Iwama, Kanagawa (JP); Mari Yoshihara, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 0 days.

(21) Appl. No.: 18/162,936

(22) Filed: Feb. 1, 2023

(65) Prior Publication Data

US 2024/0103060 A1 Mar. 28, 2024

(30) Foreign Application Priority Data

Sep. 28, 2022 (JP) ................................. 2022-155572

(51) Int. Cl.
*G01R 29/26* (2006.01)
*G01R 23/16* (2006.01)

(52) U.S. Cl.
CPC ............. *G01R 29/26* (2013.01); *G01R 23/16* (2013.01)

(58) Field of Classification Search
CPC ................................. G01R 29/26; G01R 23/16
See application file for complete search history.

(56) References Cited

U.S. PATENT DOCUMENTS 7,898,583 B2 * 3/2011 Wakahara ................. G06T 5/50
348/252

FOREIGN PATENT DOCUMENTS

| | | |
|---|---|---|
| JP | 2001-257672 A | 9/2001 |
| JP | 6318727 B2 | 5/2018 |
| WO | WO 2013112771 A1 * | 8/2013 ............. A61B 5/742 |

* cited by examiner

*Primary Examiner* — Tung S Lau

(74) *Attorney, Agent, or Firm* — Oliff PLC

(57) ABSTRACT

An information processing apparatus includes a processor configured to: obtain electrical noise generated from a memory included in a target product; determine, for each of frequencies obtained by dividing a frequency spectrum of the electrical noise, whether the electrical noise falls within a predetermined range, which is determined in advance for the frequency; determine, if the electrical noise falls outside the predetermined range, whether the electrical noise falls within an enlarged range, which is obtained by enlarging the predetermined range; and determine that the target product is a genuine product if a sum of a number of frequencies at which the electrical noise falls within the corresponding predetermined ranges and a number of frequencies at which the electrical noise falls outside the corresponding predetermined ranges but falls within the corresponding enlarged ranges is larger than a number of frequencies at which the electrical noise falls outside the corresponding enlarged ranges.

9 Claims, 11 Drawing Sheets

1

INFORMATION PROCESSING APPARATUS, NON-TRANSITORY COMPUTER READABLE MEDIUM, AND METHOD FOR PROCESSING INFORMATION

CROSS-REFERENCE TO RELATED APPLICATIONS

This application is based on and claims priority under 35 USC 119 from Japanese Patent Application No. 2022-155572 filed Sep. 28, 2022.

BACKGROUND

(i) Technical Field

The present disclosure relates to an information processing apparatus, a non-transitory computer readable medium, and a method for processing information.

(ii) Related Art

Japanese Patent No. 6318727 discloses an information generation circuit. The information generation circuit includes a reception unit that receives noise including both noise generated by a first system including the information generation circuit and noise generated by a second system connected to the first system. The information generation circuit also includes a conversion unit that obtains, from the noise received by the reception unit, a frequency spectrum of the noise. The information generation circuit also includes a generation unit that divides the frequency spectrum obtained by the conversion unit into plural frequency bands and that generates identification information for authenticating the first system on the basis of a maximum value of spectral intensity in each of the frequency bands.

SUMMARY

There is a technique for determining that a target product is a genuine product if electrical noise generated from a memory included in the target product falls within a predetermined range, which is determined in advance for each of frequencies obtained by dividing a frequency spectrum of the electrical noise. With this technique, deviations in electrical noise caused by different apparatuses connected to the target product can be absorbed by enlarging the predetermined range. More specifically, the deviations in electrical noise are caused by variation in capacitance between a harness and a metal plate of a connected apparatus, variation in electrical contact resistance between the connected apparatus and the target product, variation due to individual differences and thermal characteristics of a capacitive element of a static protection device connected to the harness, and the like. When the predetermined range is enlarged, however, a compatible product might be undesirably determined as a genuine product.

Aspects of non-limiting embodiments of the present disclosure relate to an information processing apparatus, a non-transitory computer readable medium, and a method for processing information capable of distinguishing between a genuine product and a compatible product, even when there are deviations in electrical noise caused by different apparatuses connected to a target product.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided an information processing apparatus including a processor configured to: obtain electrical noise generated from a memory included in a target product; determine, for each of frequencies obtained by dividing a frequency spectrum of the electrical noise, whether the electrical noise falls within a predetermined range, which is determined in advance for the frequency; determine, if the electrical noise falls outside the predetermined range, whether the electrical noise falls within an enlarged range, which is obtained by enlarging the predetermined range; and determine that the target product is a genuine product if a sum of a number of frequencies at which the electrical noise falls within the corresponding predetermined ranges and a number of frequencies at which the electrical noise falls outside the corresponding predetermined ranges but falls within the corresponding enlarged ranges is larger than a number of frequencies at which the electrical noise falls outside the corresponding enlarged ranges.

BRIEF DESCRIPTION OF THE DRAWINGS

Exemplary embodiments of the present disclosure will be described in detail based on the following figures, wherein.

DETAILED DESCRIPTION

Figures 1, 2:
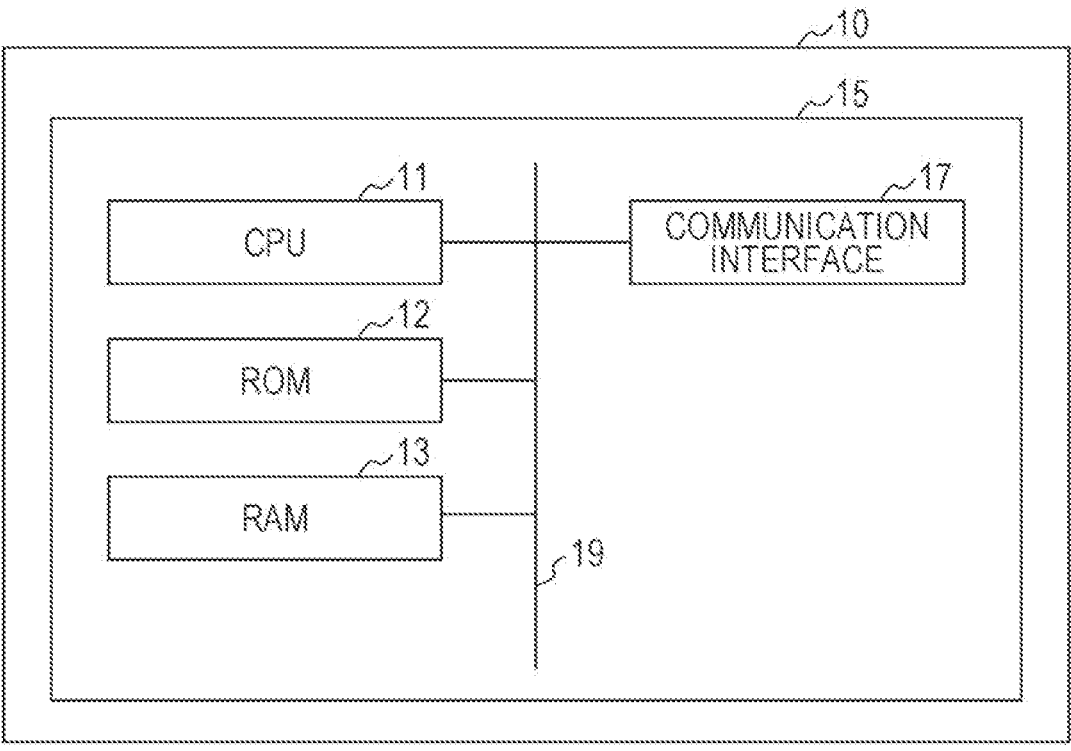
FIG. 1 is a schematic diagram illustrating an example of the hardware configuration of an information processing system according to a first exemplary embodiment.
FIG. 2 is a block diagram illustrating an example of the hardware configuration of a toner cartridge according to exemplary embodiments.

Exemplary embodiments of the present disclosure will be
described hereinafter with reference to the drawings. In each
of the drawings, the same or equivalent elements or parts are
given the same reference numerals. Dimensional ratios in
the drawings are exaggerated for convenience of description
and might be different from actual ratios.

First Exemplary Embodiment

As illustrated in FIG. 1, an information processing system
100 according to a first exemplary embodiment includes a
toner cartridge 10, which is a target product, and an infor-
mation processing apparatus 20 connected to the toner
cartridge 10. The information processing apparatus 20
includes a control device 30 and a determination circuit 40.
In the present exemplary embodiment, an image forming
apparatus is employed as the information processing appa-
ratus 20. The information processing apparatus 20, however,
is not limited to this example. Any apparatus that performs
information processing may be employed as the information
processing apparatus 20. In the present exemplary embodi-
ment, an analog front-end (AFE) is employed as the deter-
mination circuit 40.

As illustrated in FIG. 2, the toner cartridge 10 includes a
large scale integration (LSI) circuit 15. The LSI circuit 15
includes a central processing unit (CPU) 11, a read-only
memory (ROM) 12, a random-access memory (RAM) 13,
and a communication interface 17. These components are
communicably connected to one another through a bus 19.

The CPU 11 executes various programs and controls the
other components. That is, the CPU 11 reads a program from
the ROM 12 and executes the program using the RAM 13 as
a work area. The CPU 11 controls the other components and
performs various types of arithmetic processing in accor-
dance with programs stored in the ROM 12. In the present
exemplary embodiment, the ROM 12 stores a generation
process program.

The ROM 12 stores various programs and various pieces
of data. The RAM 13, which is a memory, temporarily stores
a program or data as a work area. In the present exemplary
embodiment, a computational random-access memory
(CRAM) is employed as the RAM 13.

The communication interface 17 is used to communicate
with another apparatus such as the information processing
apparatus 20.

Figure 3:
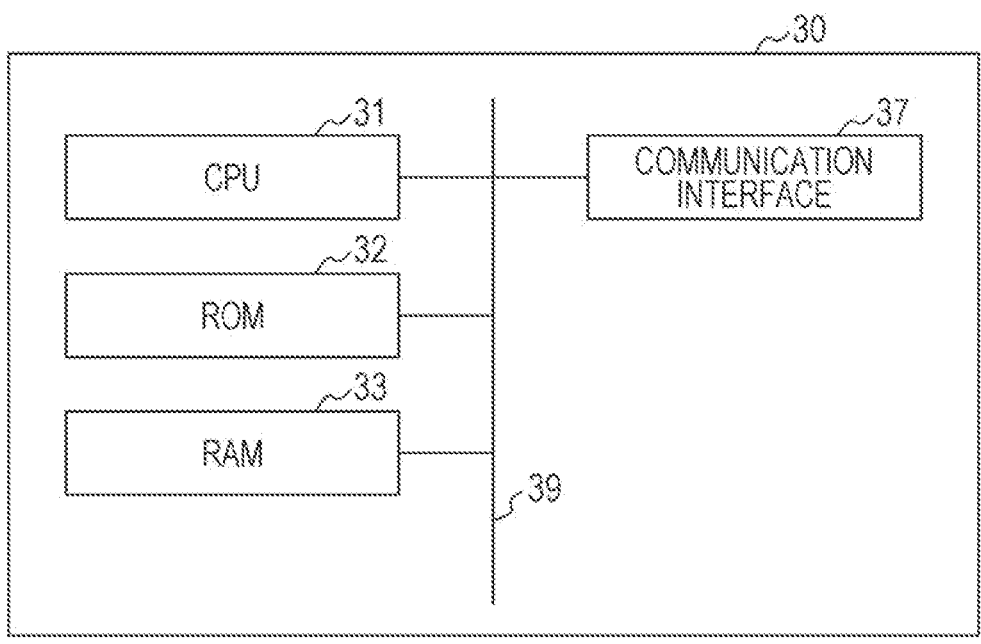
FIG. 3 is a block diagram illustrating an example of the hardware configuration of a control device according to the exemplary embodiments.

As illustrated in FIG. 3, the control device 30 includes a
CPU 31, a ROM 32, a RAM 33, and a communication
interface 37. These components are communicably con-
nected to one another through a bus 39.

The CPU 31 executes various programs and controls the
other components. That is, the CPU 31 reads a program from
the ROM 32 and executes the program using the RAM 33 as
a work area. The CPU 31 controls the other components and
performs various types of arithmetic processing in accor-
dance with programs stored in the ROM 32. In the present
exemplary embodiment, the ROM 32 stores a control pro-
cess program.

The ROM 32 stores various programs and various pieces
of data. The RAM 33 temporarily stores a program or data
as a work area.

The communication interface 37 is used to communicate
with another apparatus such as the determination circuit 40.

Figure 4:
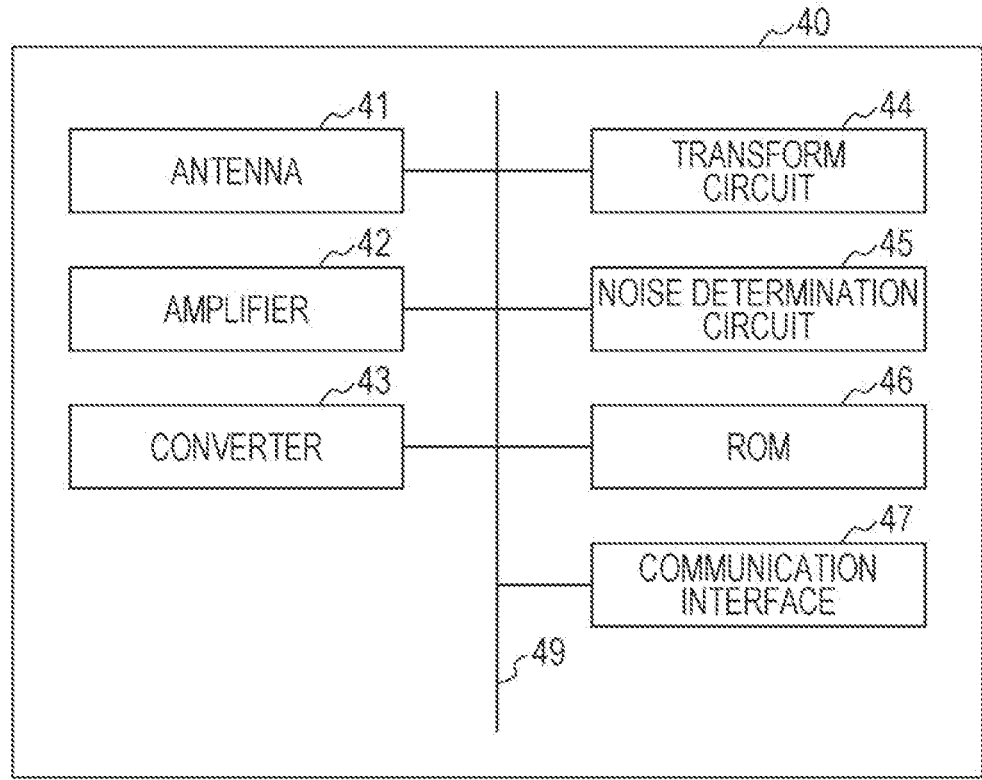
FIG. 4 is a block diagram illustrating an example of the hardware configuration of a determination circuit according to the exemplary embodiments.

As illustrated in FIG. 4, the determination circuit 40
includes an antenna 41, an amplifier 42, a converter 43, a
transform circuit 44, a noise determination circuit 45, a
ROM 46, and a communication interface 47. These compo-
nents are communicably connected to one another through a
bus 49.

The antenna 41, which is an obtainer, obtains electrical
noise generated from the RAM 13 of the toner cartridge 10
(i.e., operational noise unique to the LSI circuit 15) and
electrical noise coming from an environment outside the
toner cartridge 10 (e.g., temperature and the other compo-
nents).

The amplifier 42 is a low-noise amplifier (LNA), for
example, and amplifies electrical noise obtained by the
antenna 41. The converter 43 samples the electrical noise
amplified by the amplifier 42, converts the sampled electri-
cal noise into digital data, and outputs the digital data.

The transform circuit 44 transforms data along a time axis
output from the converter 43 into data along a frequency axis
(frequency spectrum). The transform circuit 44 performs a
fast Fourier transform (FFT) on the data along the time axis,
for example, to transform the data from a time domain into
a frequency domain.

The noise determination circuit 45, which is a determiner,
determines whether the toner cartridge 10 is a genuine
product. Here, a genuine product is a product manufactured
or sold by a manufacturer of the information processing
apparatus 20. A compatible product, which is not a genuine
product, is a product that is manufactured or sold by a party
other than the manufacturer of the information processing
apparatus 20 and that is not recommended or permitted by
the manufacturer of the information processing apparatus
20.

The ROM 46 stores a table where a range of electrical
noise is determined for each of different frequencies. More
specifically, on the table, a predetermined range and an
extended range, which is obtained by extending the prede-
termined range, are determined for each frequency. The
ROM 32 of the control device 30, too, stores the table.

The communication interface 47 is used to communicate
with other apparatuses such as the toner cartridge 10 and the
control device 30.

Next, how the information processing system 100 accord-
ing to the present exemplary embodiment performs a deter-
mination process will be described with reference to FIG. 5.
The determination process is performed when the CPU 11 of
the toner cartridge 10 reads the generation process program
from the ROM 12, loads the generation process program into
the RAM 13, and executes the generation process program.
The determination process is also performed when the CPU
31 of the control device 30 reads the control process
program from the ROM 32, loads the control process
program into the RAM 33, and executes the control process
program.

In the example illustrated in FIG. 5, a case will be
described where enlarged ranges are determined in advance
on the table stored in the ROM 46 through a creation
process, which will be described later.

Figure 5:
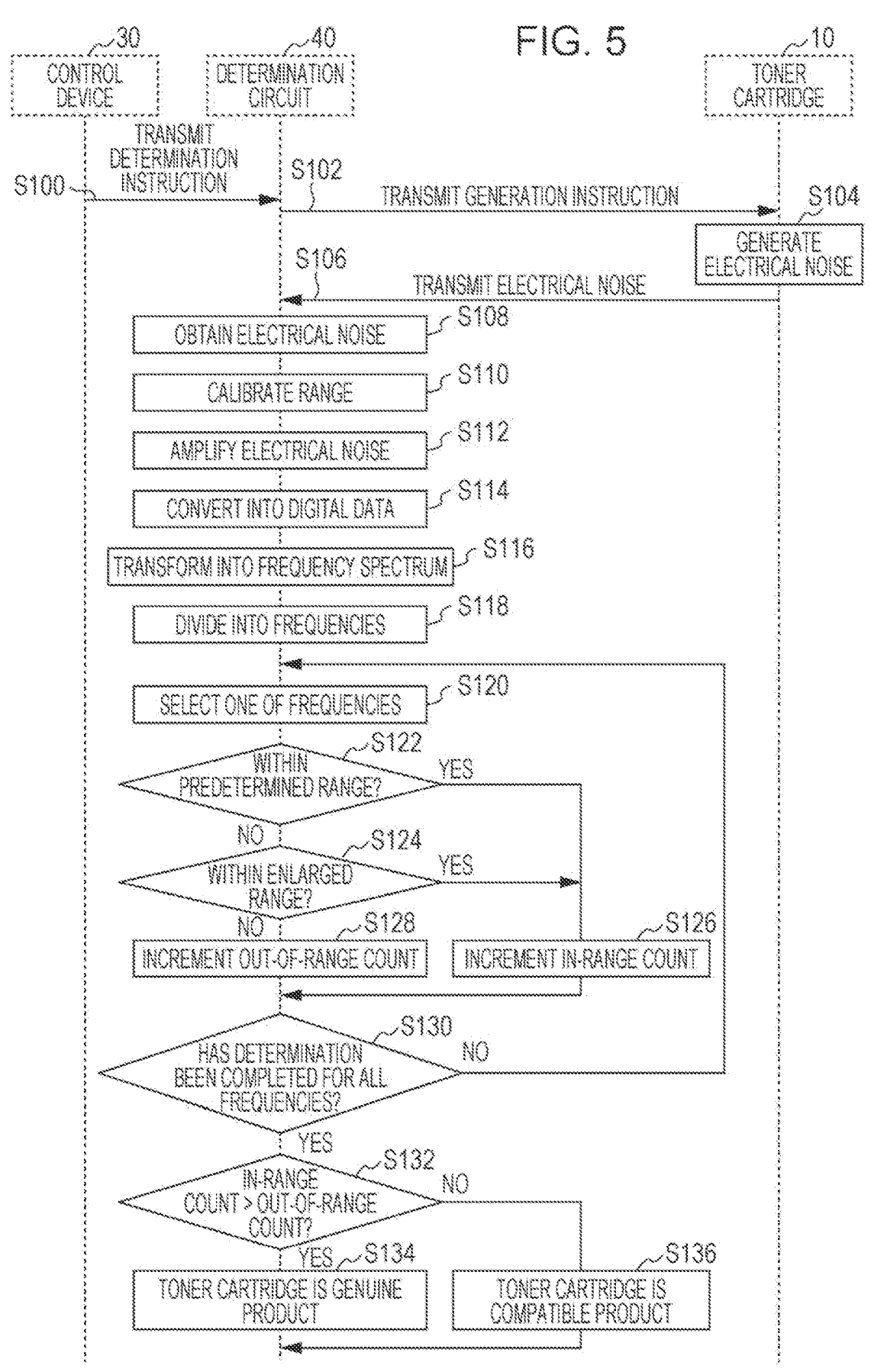
FIG. 5 is a sequence diagram illustrating an example of how a determination process according to the first exemplary embodiment is performed.

In step S100 illustrated in FIG. 5, the CPU 31 of the
control device 30 transmits a determination instruction to the
determination circuit 40 in order to determine whether the
toner cartridge 10 is a genuine product. In the present
exemplary embodiment, when the CPU 31 receives infor-
mation indicating that the toner cartridge 10 has been attached to the information processing apparatus 20, the CPU 31 transmits the determination instruction to the determination circuit 40.

In step S102, the determination circuit 40 transmits a generation instruction to the toner cartridge 10 in order to generate electrical noise.

In step S104, the CPU 11 of the toner cartridge 10 generates electrical noise in the RAM 13.

In step S106, the CPU 11 of the toner cartridge 10 transmits, to the determination circuit 40, electrical noise generated from the RAM 13.

In step S108, the antenna 41 of the determination circuit 40 obtains the electrical noise generated from the RAM 13 of the toner cartridge 10.

In step S110, the determination circuit 40 calibrates at least the predetermined ranges or the enlarged ranges determined on the table stored in the ROM 46. More specifically, the determination circuit 40 calibrates a noise filter to calibrate at least the predetermined ranges or the enlarged ranges.

In step S112, the amplifier 42 of the determination circuit 40 amplifies the obtained electrical noise to an amplitude sufficiently large with respect to a dynamic range of the converter 43.

In step S114, the converter 43 of the determination circuit 40 samples the electrical noise amplified by the amplifier 42, converts the electrical noise into digital data, and outputs the digital data.

In step S116, the transform circuit 44 of the determination circuit 40 transforms time-axis data output from the converter 43 into a frequency spectrum.

In step S118, the noise determination circuit 45 of the determination circuit 40 divides the frequency spectrum into plural frequencies.

In step S120, the noise determination circuit 45 of the determination circuit 40 selects one of the frequencies obtained as a result of the division.

In step S122, the noise determination circuit 45 of the determination circuit 40 determines whether electrical noise at the selected frequency falls within the corresponding predetermined range. More specifically, the noise determination circuit 45 determines whether the electrical noise at the selected frequency falls within the predetermined range associated on the table stored in the ROM 46 with the selected frequency. If the noise determination circuit 45 determines that the electrical noise at the selected frequency falls within the predetermined range (YES in step S122), the process proceeds to step S126. If the noise determination circuit 45 determines that the electrical noise at the selected frequency falls outside the predetermined range (NO in step S122), on the other hand, the process proceeds to step S124.

In step S124, the noise determination circuit 45 of the determination circuit 40 determines whether the electrical noise at the selected frequency falls within the corresponding enlarged range. More specifically, the noise determination circuit 45 determines whether the electrical noise at the selected frequency falls within the enlarged range associated on the table stored in the ROM 46 with the selected frequency. If the noise determination circuit 45 determines that the electrical noise at the selected frequency falls within the enlarged range (YES in step S124), the process proceeds to step S126. If the noise determination circuit 45 determines that the electrical noise at the selected frequency falls outside the enlarged range (NO in step S124), on the other hand, the process proceeds to step S128.

In step S126, the noise determination circuit 45 of the determination circuit 40 increments an in-range count (i.e., the sum of the number of frequencies at which electrical noise falls within the corresponding predetermined ranges and the number of frequencies at which electrical noise falls outside the corresponding predetermined ranges but falls within the corresponding enlarged ranges) stored in the ROM 46. "Increment" herein refers to addition of 1 to a value.

In step S128, the noise determination circuit 45 of the determination circuit 40 increments an out-of-range count (i.e., the number of frequencies at which electrical noise falls outside the corresponding enlarged ranges) stored in the ROM 46. An initial value of the in-range count and an initial count of the out-of-range count are the same.

In step S130, the noise determination circuit 45 of the determination circuit 40 determines whether the determination as to electrical noise has been completed for all the frequencies obtained as a result of the division. In other words, the noise determination circuit 45 determines whether steps S120 to S128 have been performed for electrical noise at all the frequencies obtained as a result of the division. If the noise determination circuit 45 determines that the determination as to electrical noise has been completed for all the frequencies obtained as a result of the division (YES in step S130), the process proceeds to step S132. If the noise determination circuit 45 determines that the determination as to electrical noise has not been completed for all the frequencies obtained as a result of the division (NO in step S130), on the other hand, the process returns to step S120.

In step S132, the noise determination circuit 45 of the determination circuit 40 determines whether the in-range count is larger than the out-of-range count. If the noise determination circuit 45 determines that the in-range count is larger than the out-of-range count (YES in step S132), the process proceeds to step S134. If the noise determination circuit 45 determines that the in-range count is smaller than or equal to the out-of-range count (NO in step S132), on the other hand, the process proceeds to step S136.

In step S134, the noise determination circuit 45 of the determination circuit 40 determines that the toner cartridge 10 is a genuine product, and the determination process ends.

In step S136, the noise determination circuit 45 of the determination circuit 40 determines that the toner cartridge 10 is a compatible product, and the determination process ends.

Figure 6:
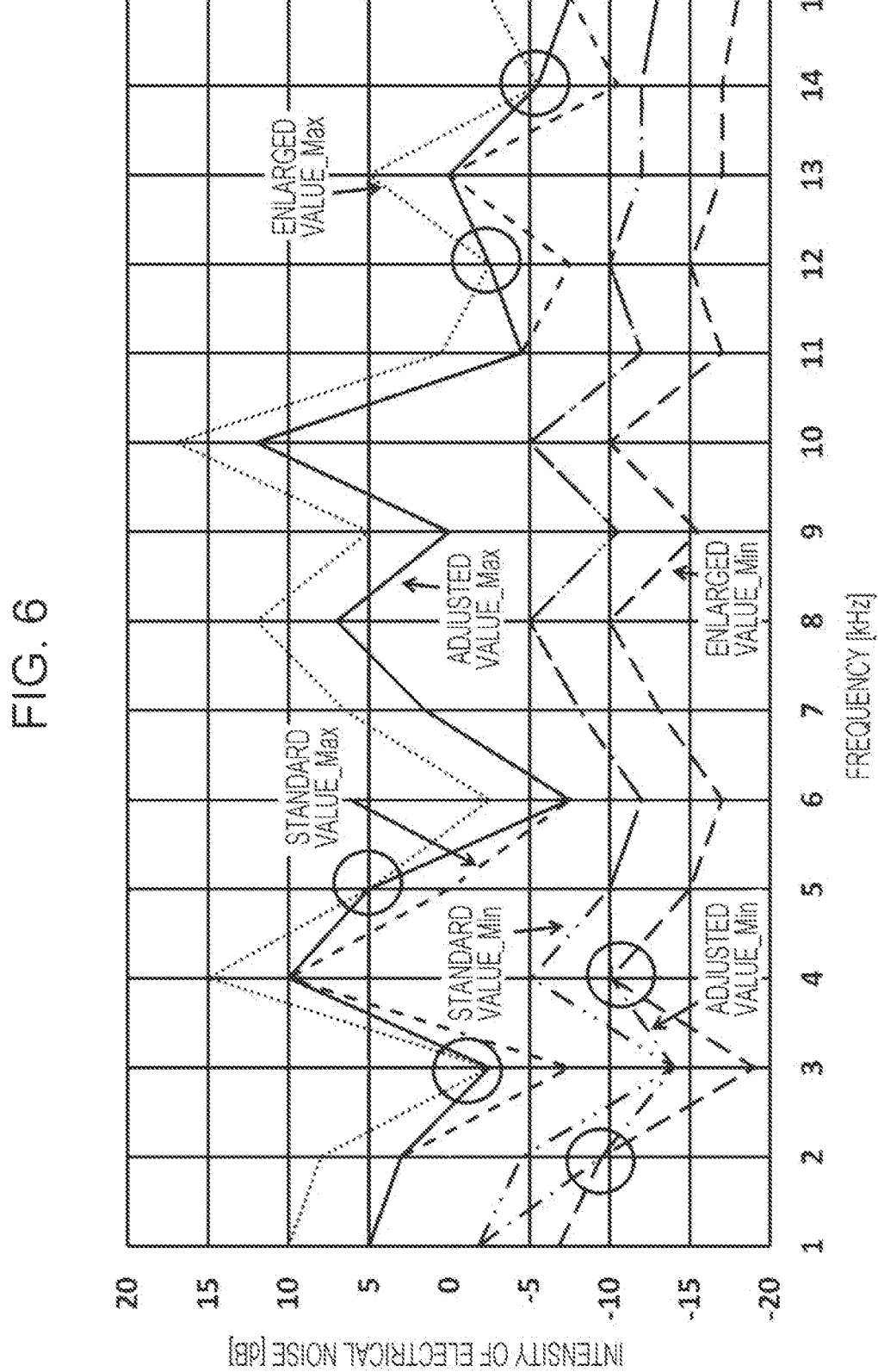
FIG. 6 is a schematic diagram illustrating an example of adjusted ranges according to the exemplary embodiments.

FIG. 6 illustrates an example of adjusted ranges. The adjusted ranges refer to ranges of electrical noise for determining whether the toner cartridge 10 is a genuine product. In FIG. 6, a vertical axis represents intensity of electrical noise, and a horizontal axis represents frequency. In FIG. 6, "adjusted value_max" indicates a maximum value of an adjusted range, and "adjusted value_min" indicates a minimum value of an adjusted range.

The noise determination circuit 45 does not determine, for frequencies at which electrical noise falls within the corresponding predetermined ranges (ranges from "standard value_min" to "standard value_max" in the example illustrated in FIG. 6), whether the electrical noise falls within the corresponding enlarged ranges. In FIG. 6, therefore, at the frequencies at which electrical noise falls within the corresponding predetermined ranges, "adjusted value_max" and "standard value_max" match, and "adjusted value_min" and "standard value_min" match.

For frequencies at which electrical noise falls outside the corresponding predetermined ranges (frequencies of 2 kHz, 3 kHz, 4 kHz, and 5 kHz in the example illustrated in FIG. 6), on the other hand, the noise determination circuit 45 determines whether the electrical noise falls within the corresponding enlarged ranges (ranges from "enlarged value_min" to "enlarged value_max" in the example illustrated in FIG. 6). In the present exemplary embodiment, a range obtained by enlarging a predetermined range by the same value for each frequency is employed as an enlarged range. The "same value" is a value determined in advance for each of types of information processing apparatus 20. The enlarged range, however, is not limited to this example. A range obtained by enlarging a predetermined range by a value different for each frequency may be employed as an enlarged range, instead. At the frequencies at which electrical noise falls outside the corresponding predetermined ranges in FIG. 6, "adjusted value_max" and "enlarged value_max" match, and "adjusted value_min" and "enlarged value_min" match.

Figure 7:
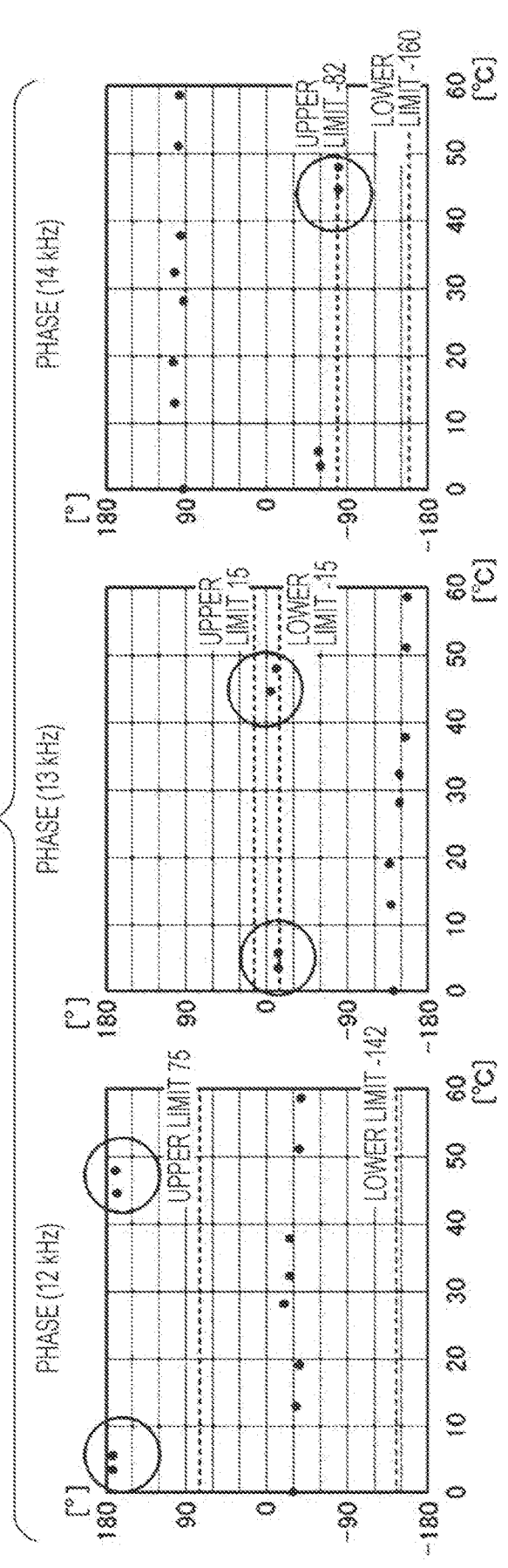
FIG. 7 is a schematic diagram illustrating an example of phases of electrical noise before calibration according to the exemplary embodiments.

FIG. 7 illustrates phases of electrical noise at different atmospheric temperatures before the noise filter is calibrated. In FIG. 7, when frequency is 12 kHz and a predetermined range is from −142° to 75°, a phase of electrical noise falls within the predetermined range at atmospheric temperatures other than 3° C. to 5° C. and 44° C. to 47° C. At atmospheric temperatures of 3° C. to 5° C. and 44° C. to 47° C., however, the phase of electrical noise falls outside the predetermined range. When frequency is 13 kHz and predetermined ranges are −180° to −15° and 15° to 180°, a phase of electrical noise falls within the predetermined ranges at atmospheric temperatures other than 3° C. to 5° C. and 44° C. to 47° C. At atmospheric temperatures of 3° C. to 5° C. and 44° C. to 47° C., however, the phase of electrical noise falls outside the predetermined ranges. When frequency is 14 kHz and predetermined ranges are −180° to −160° and −62° to 180°, a phase of electrical noise falls within the predetermined ranges at atmospheric temperatures other than 3° C. to 5° C. and 44° C. to 47° C. At atmospheric temperatures of 3° C. to 5° C. and 44° C. to 47° C., however, the phase of electrical noise falls outside the predetermined ranges.

Figure 8:
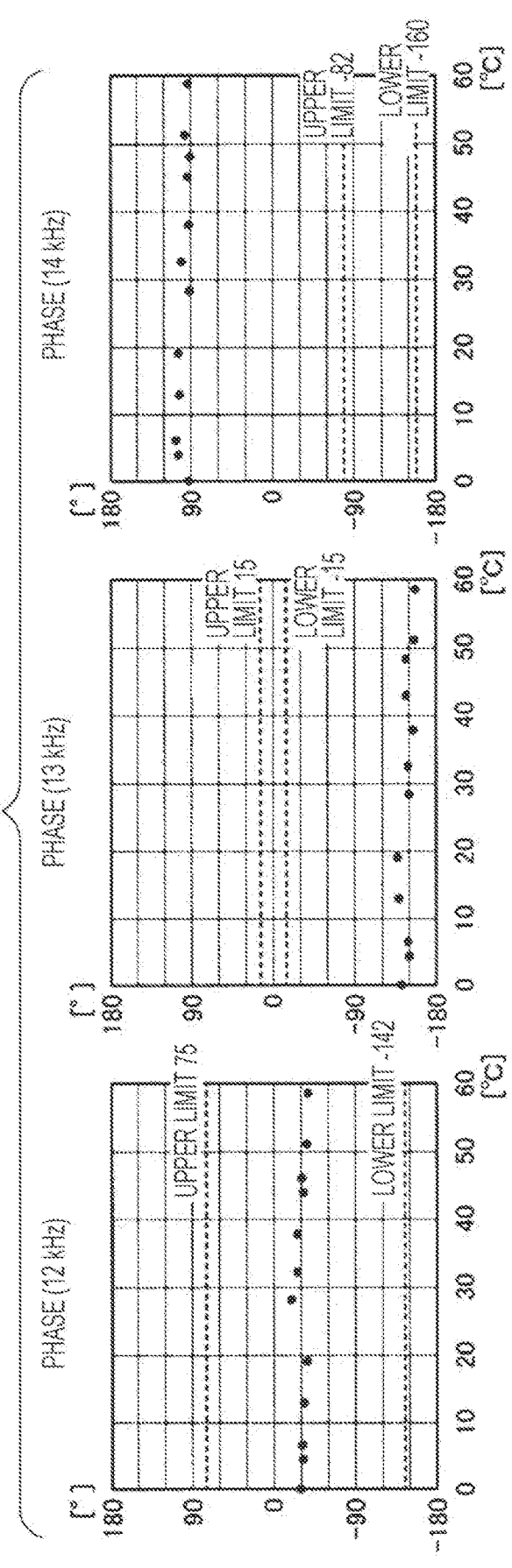
FIG. 8 is a schematic diagram illustrating an example of phases of electrical noise after the calibration according to the exemplary embodiment.

FIG. 8 illustrates phases of electrical noise at different atmospheric temperatures after the noise filter is calibrated. In FIG. 8, unlike in FIG. 7, when frequency is 12 kHz, the phase of electrical noise falls within the predetermined range even at atmospheric temperatures of 3° C. to 5° C. and 44° C. to 47° C. When frequency is 13 kHz, the phase of electrical noise falls within the predetermined ranges even at atmospheric temperatures of 3° C. to 5° C. and 44° C. to 47° C. When frequency is 14 kHz, the phase of electrical noise falls within the predetermined ranges even at atmospheric temperatures of 3° C. to 5° C. and 44° C. to 47° C.

As described above, by calibrating the noise filter each time a toner cartridge 10 is attached to the information processing apparatus 20, whether the toner cartridge 10 is a genuine product can be accurately determined, since electrical noise can be generated in accordance with temperature of a surrounding environment.

In addition, in the present exemplary embodiment, the noise determination circuit 45 of the determination circuit 40 determines whether the toner cartridge 10 is a genuine product on the basis of whether the in-range count is larger than the out-of-range count by 1 or more. A condition for determining whether the toner cartridge 10 is a genuine product, however, is not limited to this. The noise determination circuit 45 of the determination circuit 40 may change the condition for determining whether the toner cartridge 10 is a genuine product for each of information processing apparatuses 20, each of types of information processing apparatus 20, or each of internal temperatures of the information processing apparatus 20.

In addition, when electrical noise at a certain frequency does not fall within a predetermined range or an enlarged range, the noise determination circuit 45 of the determination circuit 40 may determine that the toner cartridge 10 is a compatible product, even if the in-range count is larger than the out-of-range count. In addition, even when the in-range count is smaller than or equal to the out-of-range count, the noise determination circuit 45 of the determination circuit 40 may determine that the toner cartridge 10 is a genuine product, if additional information other than the in-range count and the out-of-range count satisfies a predetermined condition. Even when the in-range count is smaller than or equal to the out-of-range count, for example, the noise determination circuit 45 determines that the toner cartridge 10 is a genuine product, if there is a record indicating that the in-range count was larger than the out-of-range count by 1 or more in past 24 hours. In addition, even when the in-range count is smaller than or equal to the out-of-range count, the noise determination circuit 45 may determine that the toner cartridge 10 is a genuine product, if a number written on a box that contained the toner cartridge 10 matches a predetermined number.

In addition, when the toner cartridge 10 has been determined as a compatible product and new information (e.g., a number written on a box that contained the toner cartridge 10) is to be obtained from the user, the noise determination circuit 45 of the determination circuit 40 may determine that the toner cartridge 10 is a genuine product, if the in-range count is larger than the out-of-range count by 2 or more. That is, when the toner cartridge 10 has been determined as a compatible product and new information is to be obtained from the user, the noise determination circuit 45 of the determination circuit 40 need not determine that the toner cartridge 10 is a genuine product unless a stricter condition than when the toner cartridge 10 has been determined as a compatible product but new information is not to be obtained from the user is satisfied.

Next, how the information processing system 100 according to the present exemplary embodiment performs the creation process will be described with reference to FIG. 9. The creation process is performed when the CPU 11 of the toner cartridge 10 reads the generation process program from the ROM 12, loads the generation process program into the RAM 13, and executes the generation process program. The creation process is also performed when the CPU 31 of the control device 30 reads the control process program from the ROM 32, loads the control process program into the RAM 33, and executes the control process program. The toner cartridge 10 that performs the creation process is a genuine product.

Figure 9:
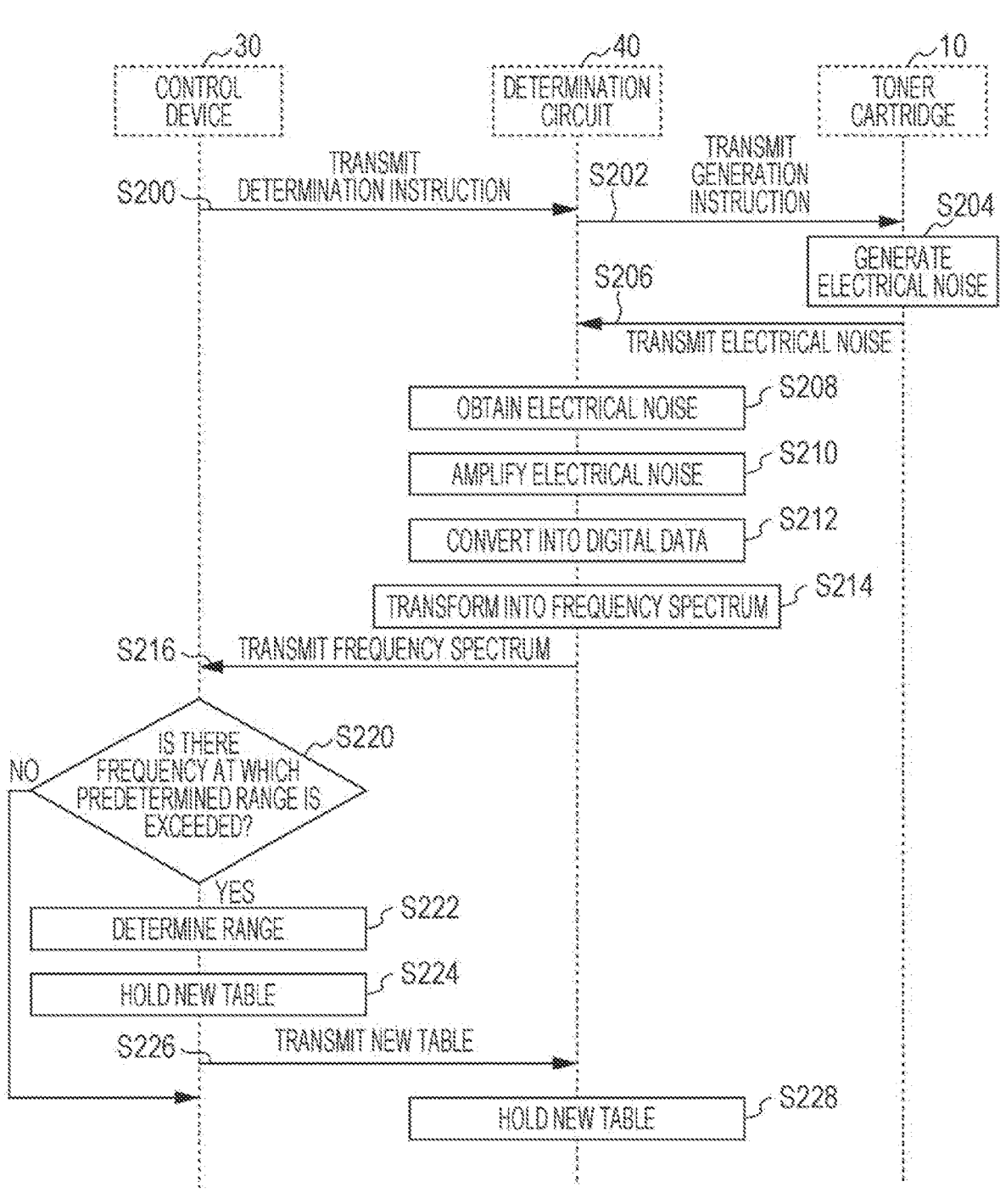
FIG. 9 is a sequence diagram illustrating an example of how a creation process according to the first exemplary embodiment is performed.

In step S200 illustrated in FIG. 9, the CPU 31 of the control device 30 transmits an instruction to the determination circuit 40 in order to create a table.

In step S202, the determination circuit 40 transmits a generation instruction to the toner cartridge 10.

In step S204, the CPU 11 of the toner cartridge 10 generates electrical noise in the RAM 13.

In step S206, the CPU 11 of the toner cartridge 10 transmits electrical noise generated from the RAM 13 to the determination circuit 40.

In step S208, the antenna 41 of the determination circuit 40 obtains the electrical noise generated from the RAM 13 of the toner cartridge 10.

In step S210, the amplifier 42 of the determination circuit 40 amplifies the obtained electrical noise to an amplitude sufficiently large with respect to the dynamic range of the converter 43.

In step S212, the converter 43 of the determination circuit 40 samples the electrical noise amplified by the amplifier 42, converts the sampled electrical noise into digital data, and outputs the digital data.

In step S214, the transform circuit 44 of the determination circuit 40 transforms time-axis data output from the converter 43 into a frequency spectrum.

In step S216, the transform circuit 44 of the determination circuit 40 transmits the frequency spectrum obtained as a result of the conversion to the control device 30.

In step S218, the CPU 31 of the control device 30 reads a table already stored in the ROM 32 (a table already stored in the ROM 46 of the determination circuit 40).

In step S220, the CPU 31 of the control device 30 determines whether, in the frequency spectrum transmitted from the determination circuit 40, there is a frequency at which electrical noise exceeds a corresponding range determined on the table already stored in the ROM 32. More specifically, the CPU 31 compares the table already stored in the ROM 32 with the frequency spectrum transmitted from the determination circuit 40 and determines whether, in the frequency spectrum transmitted from the determination circuit 40, there is a frequency at which electrical noise exceeds a corresponding range determined on the table already stored in the ROM 32. If, in the frequency spectrum transmitted from the determination circuit 40, there is a frequency at which electrical noise exceeds a corresponding range determined on the table already stored in the ROM 32 (YES in step S220), the process proceeds to step S222. If, in the frequency spectrum transmitted from the determination circuit 40, there is no frequency at which electrical noise exceeds a corresponding range determined on the table already stored in the ROM 32 (NO in step S320), on the other hand, the creation process ends.

In step S222, the CPU 31 of the control device 30 determines a new range for electrical noise on the table. More specifically, the CPU 31 enlarges, at the frequency determined in step S220, the range (a predetermined range or an enlarged range) for electrical noise determined on the table already stored in the ROM 32 to the frequency spectrum transmitted from the determination circuit 40.

In step S224, the CPU 31 of the control device 30 writes the table on which the new range for electrical noise has been determined to the ROM 32 to hold the table.

In step S226, the CPU 31 of the control device 30 transmits, to the determination circuit 40, the table on which the new range for electrical noise has been determined.

In step S228, the determination circuit 40 writes the table received from the control device 30 to the ROM 46 to hold the table, and the creation process ends.

In the present exemplary embodiment, the CPU 31 of the single control device 30 determines a new range for electrical noise on the basis of a frequency spectrum of electrical noise obtained from the single toner cartridge 10. How a new range is determined, however, is not limited to this example. For example, a cloud server may collect and analyze electrical noise obtained by CPUs 31 of plural control devices 30 from a single toner cartridge 10 in order to achieve optimal standard ranges and enlarged ranges, instead.

In addition, in the present exemplary embodiment, if, in a transmitted spectrum, there is no frequency at which electrical noise exceeds a corresponding range determined on the table already stored in the ROM 32, the CPU 31 ends the creation process. How the creation process is performed, however, is not limited to this example. For example, if, in a transmitted frequency spectrum, there is a frequency at which electrical noise falls below a corresponding range determined on the table already stored in the ROM 32, the CPU 31 may reduce the range to the frequency spectrum at the frequency as a new range on the table.

Next, how the information processing system 100 according to the present exemplary embodiment performs a change process will be described with reference to FIG. 10. The change process is performed when the CPU 31 of the control device 30 reads the control process program from the ROM 32, loads the control process program into the RAM 33, and executes the control process program.

Figure 10:
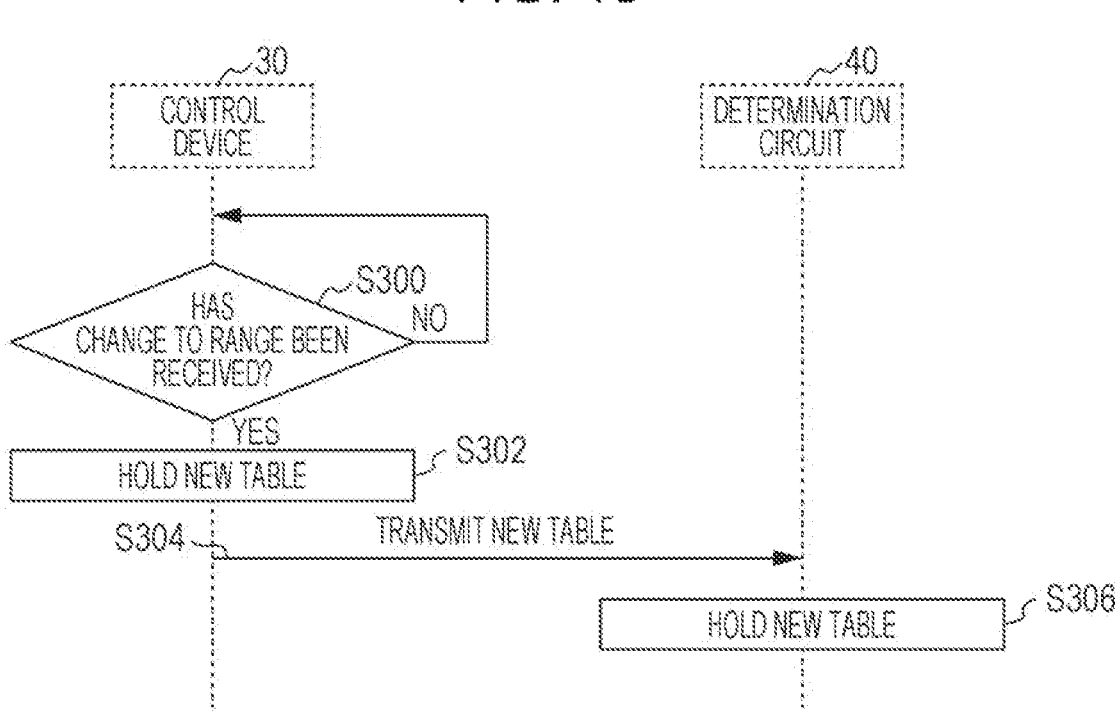
FIG. 10 is a sequence diagram illustrating an example of how a change process according to the first exemplary embodiment is performed.

In step S300 illustrated in FIG. 10, the CPU 31 of the control device 30 waits for a change to at least a predetermined range or an enlarged range on the table. If the control device 30 of the CPU 31 receives a change to at least a predetermined range or an enlarged range on the table (YES in step S300), the process proceeds to step S302.

In step S302, the CPU 31 of the control device 30 holds the table on which the received new range has been written. The CPU 31 of the control device 30 then deletes the old range.

In step S304, the CPU 31 of the control device 30 transmits, to the determination circuit 40, the table on which the new range has been written.

In step S306, the determination circuit 40 holds the table received from the control device 30 as a new table, and the change process ends.

Second Exemplary Embodiment

In the first exemplary embodiment, the determination circuit 40, which is hardware separate from the control device 30, determines whether the toner cartridge 10 is a genuine product. In a second exemplary embodiment, the CPU 31, which is software, of the control device 30 determines whether the toner cartridge 10 is a genuine product.

Figure 11:
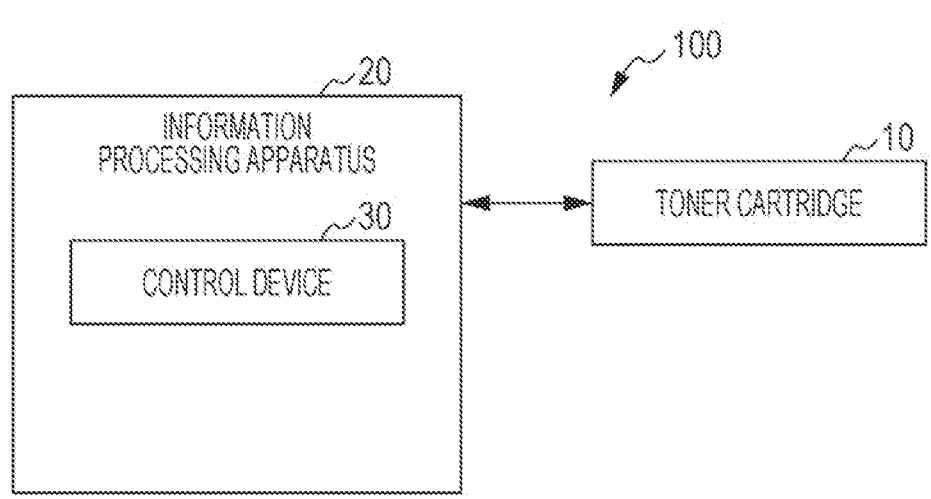
FIG. 11 is a schematic diagram illustrating an example of the hardware configuration of an information processing system according to a second exemplary embodiment.

As illustrated in FIG. 11, in an information processing system 100 according to the present exemplary embodiment, the information processing apparatus 20 includes only the control device 30 unlike in the first exemplary embodiment.

The hardware configuration of the toner cartridge 10 and the control device 30 according to the present exemplary embodiment is the same as that according to the first exemplary embodiment (refer to FIGS. 2 and 3), and description thereof is omitted here.

Next, how the information processing system 100 according to the present exemplary embodiment performs the determination process will be described with reference to FIG. 12. The determination process is performed when the CPU 11 of the image forming apparatus 10 reads the generation process program from the ROM 12, loads the generation process program into the RAM 13, and executes the generation process program. The determination process is also performed when the CPU 31 of the control device 30 reads the control process program, which is a program for processing information, from the ROM 32, loads the control process program into the RAM 33, and executes the control process program.

Figure 12:
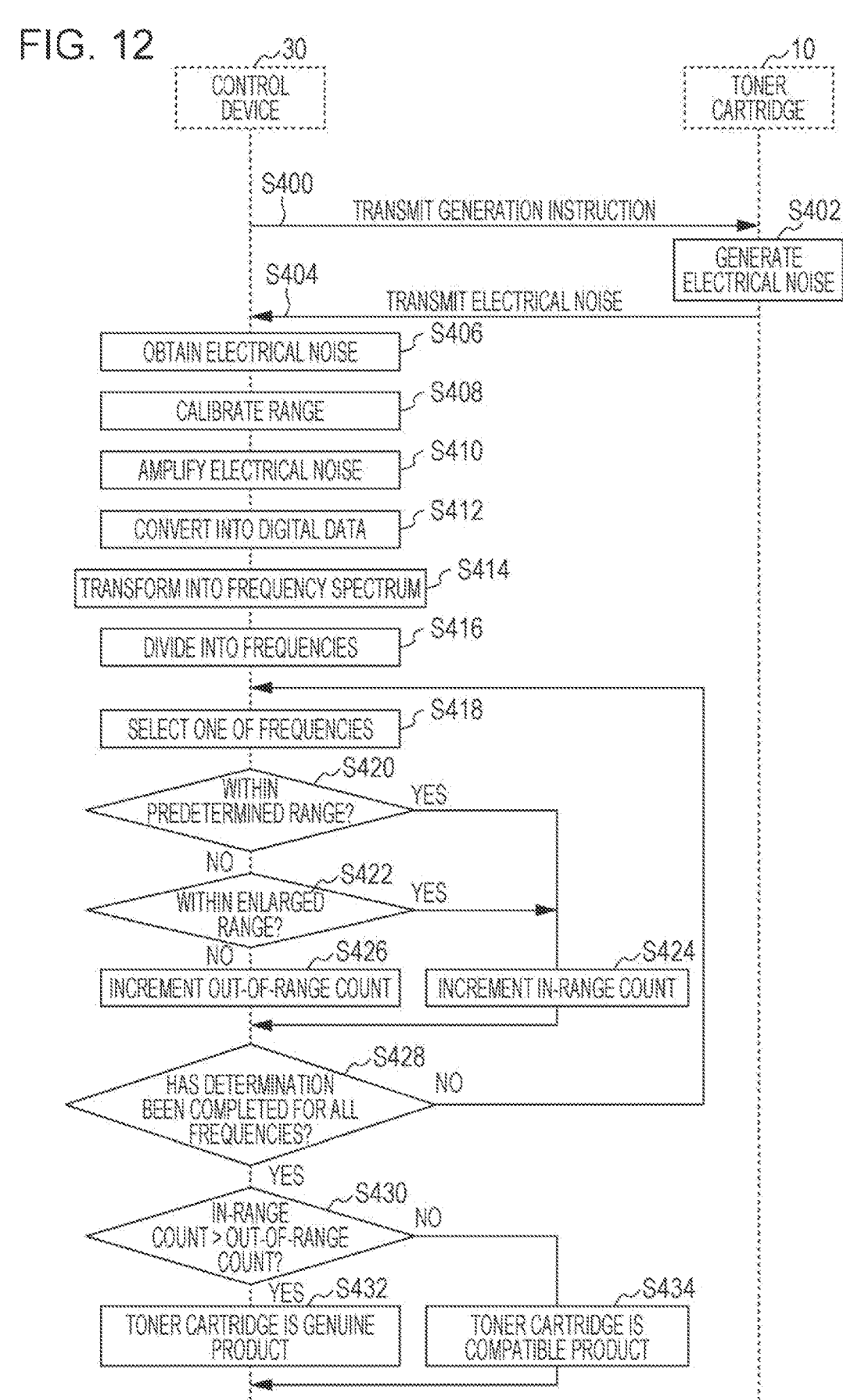
FIG. 12 is a sequence diagram illustrating an example of how a determination process according to the second exemplary embodiment is performed.

In step S400 illustrated in FIG. 12, the CPU 31 of the control device 30 transmits a generation instruction to the toner cartridge 10.

In step S402, the CPU 11 of the toner cartridge 10 generates electrical noise in the RAM 13.

In step S404, the CPU 11 of the toner cartridge 10 transmits electrical noise generated from the RAM 13 to the control device 30.

In step S406, the CPU 31 of the control device 30 obtains the electrical noise generated from the RAM 13 of the toner cartridge 10.

In step S408, the CPU 31 calibrates at least a predetermined range or an enlarged range determined on the table stored in the ROM 32.

In step S410, the CPU 31 amplifies the obtained electrical noise to a sufficiently large amplitude.

In step S412, the CPU 31 samples the amplified electrical noise, converts the sampled electrical noise into digital data, and outputs the digital data.

In step S414, the CPU 31 transforms output time-axis data into a frequency spectrum.

In step S416, the CPU 31 divides the frequency spectrum into plural frequencies.

In step S418, the CPU 31 selects one of the frequencies obtained as a result of the division.

In step S420, the CPU 31 determines whether electrical noise at the selected frequency falls within a corresponding predetermined range. More specifically, the CPU 31 determines whether electrical noise at the selected frequency falls within a predetermined range associated on the table stored in the ROM 32 with the selected frequency. If the CPU 31 determines that the electrical noise at the selected frequency falls within the predetermined range (YES in step S420), the process proceeds to step S424. If the CPU 31 determines that the electrical noise at the selected frequency falls outside the predetermined range (NO in step S420), on the other hand, the process proceeds to step S422.

In step S422, the CPU 31 determines whether the electrical noise at the selected frequency falls within a corresponding enlarged range. More specifically, the CPU 31 determines whether the electrical noise at the selected frequency falls within an enlarged range associated on the table stored in the ROM 32 with the selected frequency. If the CPU 31 determines that the electrical noise at the selected frequency falls within the enlarged range (YES in step S422), the process proceeds to step S424. If the CPU 31 determines that the electrical noise at the selected frequency falls outside the enlarged range (NO in step S422), on the other hand, the process proceeds to step S426.

In step S424, the CPU 31 increments an in-range count (i.e., the sum of the number of frequencies at which electrical noise falls within the corresponding predetermined ranges and the number of frequencies at which electrical noise falls outside the corresponding predetermined ranges but falls within the corresponding enlarged ranges) stored in the ROM 32.

In step S426, the CPU 31 increments an out-of-range count (i.e., the number of frequencies at which electrical noise falls outside the corresponding enlarged ranges) stored in the ROM 32.

In step S428, the CPU 31 determines whether the determination as to electrical noise has been completed for all the frequencies obtained as a result of the division. In other words, the CPU 31 determines whether steps S418 to S426 have been performed for electrical noise at all the frequencies obtained as a result of the division. If the CPU 31 determines that the determination as to electrical noise has been completed for all the frequencies obtained as a result of the division (YES in step S428), the process proceeds to step S430. If the CPU 31 determines that the determination as to electrical noise has not been completed for all the frequencies obtained as a result of the division (NO in step S428), on the other hand, the process returns to step S418.

In step S430, the CPU 31 determines whether the in-range count is larger than the out-of-range count. If the CPU 31 determines that the in-range count is larger than the out-of-range count (YES in step S430), the process proceeds to step S432. If the CPU 31 determines that the in-range count is smaller than or equal to the out-of-range count (NO in step S430), on the other hand, the process proceeds to step S434.

In step S432, the CPU 31 determines that the toner cartridge 10 is a genuine product, and the determination process ends.

In step S434, the CPU 31 determines that the toner cartridge 10 is a compatible product, and the determination process ends.

Next, how the information processing system 100 according to the present exemplary embodiment performs the creation process will be described with reference to FIG. 13. The creation process is performed when the CPU 11 of the toner cartridge 10 reads the generation process program from the ROM 12, loads the generation process program into the RAM 13, and executes the generation process program. The creation process is also performed when the CPU 31 of the control device 30 reads the control process program, which is the program for processing information, from the ROM 32, loads the control process program into the RAM 33, and executes the control process program. The toner cartridge 10 that performs the creation process is a genuine product.

Figure 13:
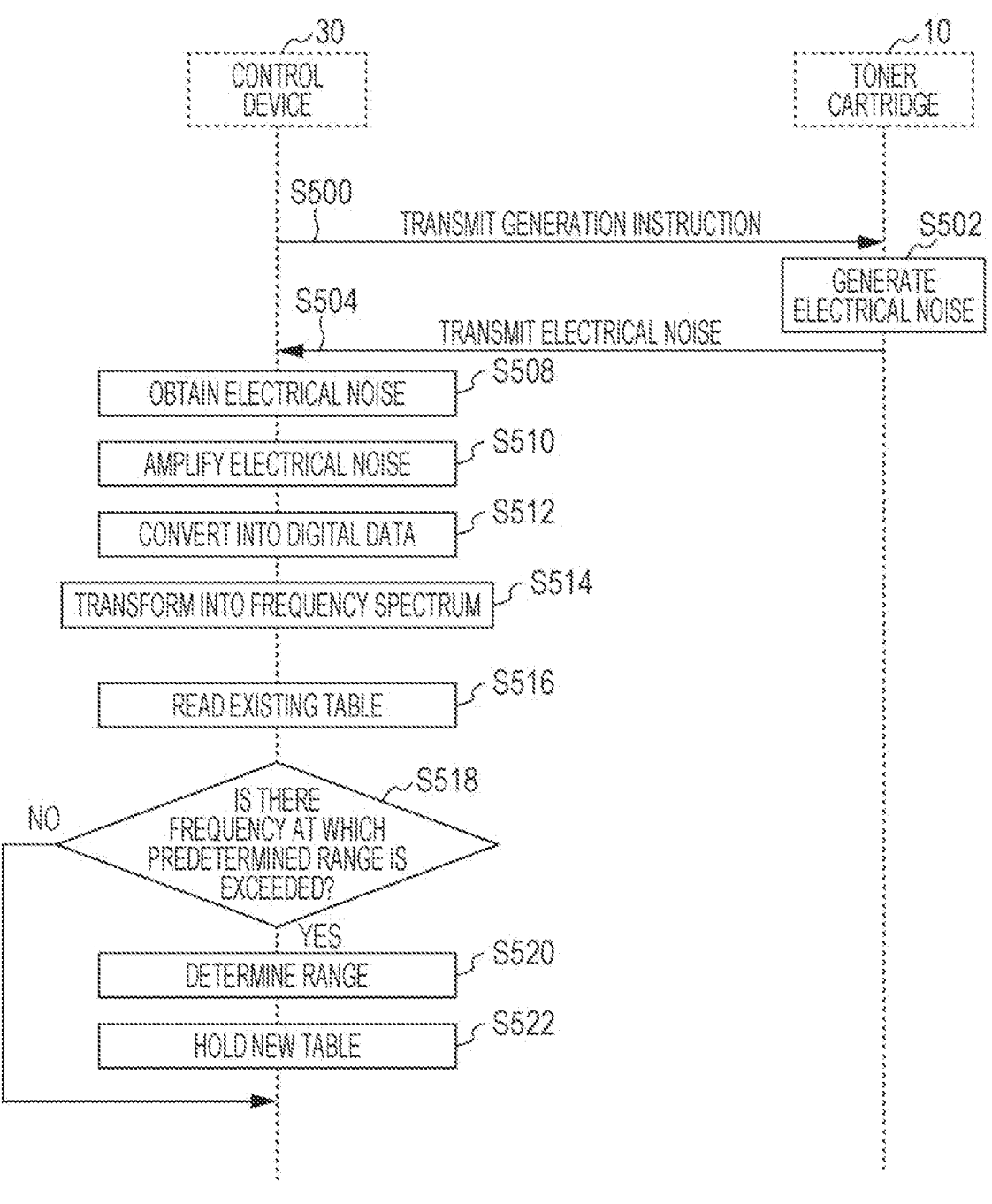
FIG. 13 is a sequence diagram illustrating an example of how a creation process according to the second exemplary embodiment is performed.

In step S500 illustrated in FIG. 13, the CPU 31 of the control device 30 transmits a generation instruction to the toner cartridge 10.

In step S502, the CPU 11 of the toner cartridge 10 generates electrical noise in the RAM 13.

In step S504, the CPU 11 of the toner cartridge 10 transmits, to the control device 30, electrical noise generated from the RAM 13.

In step S506, the CPU 31 of the control device 30 obtains the electrical noise generated from the RAM 13 of the toner cartridge 10.

In step S510, the CPU 31 amplifies the obtained electrical noise to a sufficiently large amplitude.

In step S512, the CPU 31 samples the amplified electrical noise, converts the sampled electrical noise into digital data, and outputs the digital data.

In step S514, the CPU 31 transforms output time-axis data into a frequency spectrum.

In step S516, the CPU 31 reads a table already stored in the ROM 32.

In step S518, the CPU 31 determines whether, in the transmitted frequency spectrum, there is a frequency at which electrical noise exceeds a corresponding range determined on the table already stored in the ROM 32. More specifically, the CPU 31 compares the table already stored in the ROM 32 with the transmitted frequency spectrum and determines whether, in the transmitted frequency spectrum, there is a frequency at which electrical noise exceeds a corresponding range determined on the table already stored in the ROM 32. If, in the transmitted frequency spectrum, there is a frequency at which electrical noise exceeds a corresponding range determined on the table already stored in the ROM 32 (YES in step S518), the process proceeds to step S520. If, in the transmitted frequency spectrum, there is no frequency at which electrical noise exceeds a corresponding range determined on the table already stored in the ROM 32 (NO in step S518), on the other hand, the creation process ends.

In step S520, the CPU 31 determines a new range for electrical noise on the table. More specifically, the CPU 31 enlarges the range (a predetermined range or an enlarged range) for electrical noise determined on the table already stored in the ROM 32 to a frequency spectrum at the frequency used in step S518.

In step S522, the CPU 31 writes the table on which the new range for electrical noise has been determined to the ROM 32 to hold the table, and the creation process ends.

Next, how the information processing system 100 according to the present exemplary embodiment performs the change process will be described with reference to FIG. 14. The change process is performed when the CPU 31 of the control device 30 reads the control process program from the ROM 32, loads the control process program into the RAM 33, and executes the control process program.

Figure 14:
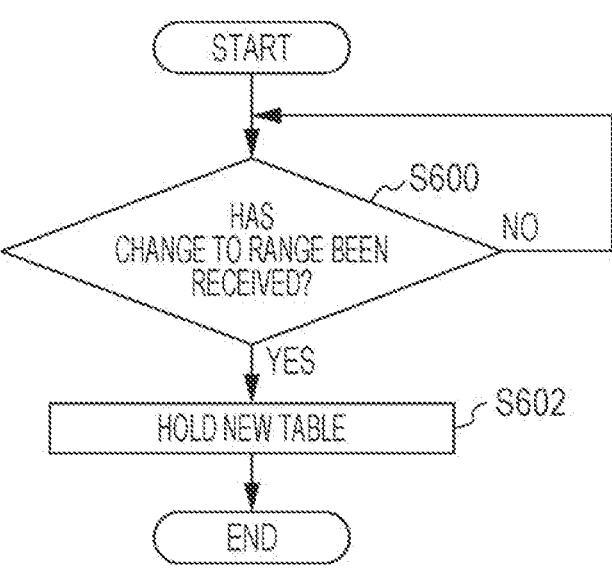
FIG. 14 is a sequence diagram illustrating an example of
how a change process according to the second exemplary
embodiment is performed.

In step S600 illustrated in FIG. 14, the CPU 31 of the control device 30 waits for a change to at least a predetermined range or an enlarged range on the table. If the control device 30 of the CPU 31 receives a change to at least a predetermined range or an enlarged range on the table (YES in step S600), the process proceeds to step S602.

In step S602, the CPU 31 of the control device 30 holds the table on which the received new range has been written, and the change process ends.

Although exemplary embodiments have been described, the technical scope of the present disclosure is not limited to the above exemplary embodiments. The above exemplary embodiments may be modified or improved in various ways insofar as the spirit of the present disclosure is not deviated from, and the technical scope of the present disclosure also includes such modifications and improvements.

The above exemplary embodiments do not limit the claims, and not all of combinations of features described in the exemplary embodiments are necessary to achieve the techniques disclosed in the present disclosure. The above exemplary embodiments includes techniques at various stages, and various techniques can be extracted by combining the disclosed elements differently. Even if some of the elements described in the exemplary embodiments are removed, a configuration without such elements can be extracted as a technique, insofar as an effect is produced.

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

In the embodiments above, the term "processor" is broad enough to encompass one processor or plural processors in collaboration which are located physically apart from each other but may work cooperatively. The order of operations of the processor is not limited to one described in the embodiments above, and may be changed.

Although the programs are installed in a ROM in the exemplary embodiments, the programs need not necessarily be installed in a ROM. The programs according to one of the exemplary embodiments may be stored in a computer readable medium and provided. For example, the programs according to one of the exemplary embodiments may be stored in an optical disc such as a compact disc read-only memory (CD-ROM) or a digital versatile disc read-only memory (DVD-ROM) or a semiconductor memory such as a universal serial bus (USB) memory or a memory card, instead. The program for processing information according to one of the exemplary embodiments may be obtained from an external apparatus through the communication interface.

Although the processes performed by the information processing system 100 are achieved through a software configuration using a computer by executing the programs, the present disclosure is not limited to this. For example, the processes performed by the information processing system 100 may be achieved through a hardware configuration or a combination of a hardware configuration and a software configuration, instead.

The configuration of the toner cartridge 10, the control device 30, and the determination circuit 40 described in the above exemplary embodiments is an example, and it is needless to say that unnecessary parts may be removed or new parts may be added insofar as the spirit of the present disclosure is not deviated from.

How the information processing system 100 performs the processes described in the above exemplary embodiments is also an example, and it is needless to say that unnecessary steps may be removed, new steps may be added, or order of processing may be changed insofar as the spirit of the present disclosure is not deviated from.

The present disclosure is not limited to the above description, and may be implemented in various modifications, instead, insofar as the spirit thereof is not deviated from.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

APPENDIX (((1)))
An information processing apparatus comprising:
a processor configured to:
    obtain electrical noise generated from a memory included in a target product;
    determine, for each of frequencies obtained by dividing a frequency spectrum of the electrical noise, whether the electrical noise falls within a predetermined range, which is determined in advance for the frequency;
    determine, if the electrical noise falls outside the predetermined range, whether the electrical noise falls within an enlarged range, which is obtained by enlarging the predetermined range; and
    determine that the target product is a genuine product if a sum of a number of frequencies at which the electrical noise falls within the corresponding predetermined ranges and a number of frequencies at which the electrical noise falls outside the corresponding predetermined ranges but falls within the corresponding enlarged ranges is larger than a number of frequencies at which the electrical noise falls outside the corresponding enlarged ranges.

15                                                          16

(((2)))

The information processing apparatus according to (((1))), wherein the processor is configured to:

read an existing table on which a range of electrical noise is determined for each of the frequencies;

determine a new range of electrical noise on a basis of the obtained electrical noise and the existing table; and update the existing table to a table on which the new range of electrical noise is determined and hold the table.

(((3)))

The information processing apparatus according to (((1))) or (((2))), wherein the processor is configured to:

receive a change to at least the predetermined range or the enlarged range; and write the at least predetermined range or enlarged range subjected to the received change and hold the at least predetermined range or enlarged range.

(((4)))

The information processing apparatus according to any one of (((1))) to (((3))), wherein the processor is configured to calibrate at least the predetermined range or the enlarged range in a case where the processor obtains the electrical noise.

(((5)))

The information processing apparatus according to (((4))), wherein the processor is configured to calibrate at least the predetermined range or the enlarged range each time the target product is attached to the information processing apparatus.

(((6)))

The information processing apparatus according to any one of (((1))) to (((5))), wherein the enlarged range is a range obtained by enlarging the predetermined range by a same value for each of the frequencies.

(((7)))

The information processing apparatus according to (((6))), wherein the same value is a value determined in advance for each of types of information processing apparatus.

(((8)))

A program causing a computer to execute a process for processing information, the process comprising:

obtaining electrical noise generated from a memory included in a target product;

determining, for each of frequencies obtained by dividing a frequency spectrum of the electrical noise, whether the electrical noise falls within a predetermined range, which is determined in advance for the frequency;

determining, if the electrical noise falls outside the predetermined range, whether the electrical noise falls within an enlarged range, which is obtained by enlarging the predetermined range; and determining that the target product is a genuine product if a sum of a number of frequencies at which the electrical noise falls within the corresponding predetermined ranges and a number of frequencies at which the electrical noise falls outside the corresponding predetermined ranges but falls within the corresponding enlarged ranges is larger than a number of frequencies at which the electrical noise falls outside the corresponding enlarged ranges.

What is claimed is:

1. An information processing apparatus comprising:

a processor configured to:

obtain electrical noise generated from a memory included in a target product;

determine, for each of frequencies obtained by dividing a frequency spectrum of the electrical noise, whether an intensity of the electrical noise falls within a predetermined range, which is determined in advance for the frequency;

determine, if the electrical noise falls outside the predetermined range, whether the electrical noise falls within an enlarged range, which is obtained by enlarging a size of a range for which the intensity of the electrical noise falls within compared to the predetermined range; and determine that the target product is a genuine product instead of a compatible product if a sum of a number of frequencies at which the electrical noise falls within the corresponding predetermined ranges and a number of frequencies at which the electrical noise falls outside the corresponding predetermined ranges but falls within the corresponding enlarged ranges is larger than a number of frequencies at which the electrical noise falls outside the corresponding enlarged ranges.

2. The information processing apparatus according to claim 1, wherein the processor is configured to:

read an existing table on which a range of electrical noise is determined for each of the frequencies;

determine a new range of electrical noise on a basis of the obtained electrical noise and the existing table; and update the existing table to a table on which the new range of electrical noise is determined and hold the table.

3. The information processing apparatus according to claim 1, wherein the processor is configured to:

receive a change to at least the predetermined range or the enlarged range; and write the at least predetermined range or enlarged range subjected to the received change and hold the at least predetermined range or enlarged range.

4. The information processing apparatus according to claim 1, wherein the processor is configured to calibrate at least the predetermined range or the enlarged range in a case where the processor obtains the electrical noise.

5. The information processing apparatus according to claim 4, wherein the processor is configured to calibrate at least the predetermined range or the enlarged range each time the target product is attached to the information processing apparatus.

6. The information processing apparatus according to claim 1, wherein the enlarged range is a range obtained by enlarging the predetermined range by a same value for each of the frequencies.

7. The information processing apparatus according to claim 6, wherein the same value is a value determined in advance for each of types of information processing apparatus.

8. A non-transitory computer readable medium storing a program causing a computer to execute a process for processing information, the process comprising:

obtaining electrical noise generated from a memory included in a target product;

determining, for each of frequencies obtained by dividing a frequency spectrum of the electrical noise, whether an intensity of the electrical noise falls within a predetermined range, which is determined in advance for the frequency;

determining, if the electrical noise falls outside the predetermined range, whether the electrical noise falls within an enlarged range, which is obtained by enlarging a size of a range for which the intensity of the electrical noise falls within compared to the predetermined range; and determining that the target product is a genuine product instead of a compatible product if a sum of a number of frequencies at which the electrical noise falls within the corresponding predetermined ranges and a number of frequencies at which the electrical noise falls outside the corresponding predetermined ranges but falls within the corresponding enlarged ranges is larger than a number of frequencies at which the electrical noise falls outside the corresponding enlarged ranges.

9. A method for processing information, the method comprising:

obtaining electrical noise generated from a memory included in a target product;

determining, for each of frequencies obtained by dividing a frequency spectrum of the electrical noise, whether an intensity of the electrical noise falls within a predetermined range, which is determined in advance for the frequency;

determining, if the electrical noise falls outside the predetermined range, whether the electrical noise falls within an enlarged range, which is obtained by enlarging a size of a range for which the intensity of the electrical noise falls within compared to the predetermined range; and determining that the target product is a genuine product instead of a compatible product if a sum of a number of frequencies at which the electrical noise falls within the corresponding predetermined ranges and a number of frequencies at which the electrical noise falls outside the corresponding predetermined ranges but falls within the corresponding enlarged ranges is larger than a number of frequencies at which the electrical noise falls outside the corresponding enlarged ranges.

* * * * *